US012604647B2

(12) United States Patent
Zhou et al.

(10) Patent No.: US 12,604,647 B2
(45) Date of Patent: Apr. 14, 2026

(54) DISPLAY PANEL AND DISPLAY APPARATUS

(71) Applicant: YUNGU (GU'AN) TECHNOLOGY CO., LTD., Langfang (CN)

(72) Inventors: Xiaokang Zhou, Langfang (CN); Zhenhua Lou, Langfang (CN); Qiqi Qin, Langfang (CN); Xiaocong Li, Langfang (CN); Hongyu Wang, Langfang (CN); Wenkai Chen, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 908 days.

(21) Appl. No.: 17/834,169

(22) Filed: Jun. 7, 2022

(65) Prior Publication Data

US 2022/0310974 A1    Sep. 29, 2022

Related U.S. Application Data

(63) Continuation of application No. PCT/CN2021/077556, filed on Feb. 24, 2021.

(30) Foreign Application Priority Data

Jun. 22, 2020    (CN) .......................... 202010575951.7

(51) Int. Cl.
H10K 59/80 (2023.01)
H10K 59/40 (2023.01)
(Continued)

(52) U.S. Cl.
CPC ..... H10K 59/8791 (2023.02); H10K 59/8731 (2023.02); H10K 59/879 (2023.02);
(Continued)

(58) Field of Classification Search
CPC .......................... H10K 59/40; H10K 59/8731
See application file for complete search history.

(56) References Cited

U.S. PATENT DOCUMENTS

2017/0357125 A1* 12/2017 Tojo ..................... H10K 59/879
2019/0067627 A1* 2/2019 Jia .......................... H10K 59/35
(Continued)

FOREIGN PATENT DOCUMENTS

| CN | 103165680 A | 6/2013 |
| CN | 107085337 A | 8/2017 |

(Continued)

OTHER PUBLICATIONS

Office Action issued on Oct. 31, 2022, in corresponding Chinese Application No. 202010575951.7, 6 pages (including partial English translation).

(Continued)

*Primary Examiner* — Zandra V Smith
*Assistant Examiner* — Molly K Reida
(74) *Attorney, Agent, or Firm* — Maier & Maier, PLLC

(57) ABSTRACT

A display panel includes: a substrate; a light emitting unit located on the substrate; and one or more combinational structure layers located on a side of the light emitting unit away from the substrate, each of the combinational structure layers includes a first structure layer, a second structure layer and a third structure layer, a refractive index of the first structure layer is greater than a refractive index of the second structure layer, and the refractive index of the second structure layer is greater than a refractive index of the third structure layer.

17 Claims, 11 Drawing Sheets

(51) Int. Cl.
  *H10K 59/35* (2023.01)
  *H10K 102/00* (2023.01)
(52) U.S. Cl.
  CPC ............. *H10K 59/35* (2023.02); *H10K 59/40*
  (2023.02); *H10K 2102/351* (2023.02)

(56) References Cited

U.S. PATENT DOCUMENTS

| | | | | |
|---|---|---|---|---|
| 2020/0117307 | A1* | 4/2020 | Jin | ........................... G06F 3/045 |
| 2020/0150722 | A1 | 5/2020 | Iwase | |
| 2020/0285347 | A1* | 9/2020 | Ma | ........................ G06F 3/0446 |

FOREIGN PATENT DOCUMENTS

| | | | | |
|---|---|---|---|---|
| CN | 107565055 | A | 1/2018 | |
| CN | 108039421 | A | 5/2018 | |
| CN | 108666344 | A | 10/2018 | |
| CN | 108807716 | A | 11/2018 | |
| CN | 109285958 | A | 1/2019 | |
| CN | 111244145 | A | 6/2020 | |
| CN | 111293227 | A | 6/2020 | |
| CN | 111710797 | A | 9/2020 | |
| WO | WO-2019105051 | A1 * | 6/2019 | ............... G09G 3/36 |

OTHER PUBLICATIONS

Office Action issued on Feb. 2, 2023, in corresponding Chinese Patent Application No. 202010575951.7; 7 pages; with Concise Explanation of Relevance in English.

International Search Report mailed May 28, 2021, in corresponding to International Application No. PCT/CN2021/077556; 7 pages (with English Translation).

The First Office Action issued Jun. 17, 2021, corresponding to Chinese Application No. 202010575951.7, 13 pages (with English Translation).

The Second Office Action issued Sep. 6, 2021, corresponding to Chinese Application No. 202010575951.7, 7 pages (with English Translation).

The Third Office Action issued Dec. 7, 2021, corresponding to Chinese Application No. 202010575951.7, 25 pages (with English Translation).

The Rejection Decision issued Feb. 28, 2022, corresponding to Chinese Application No. 202010575951.7, 7 pages (with English Translation).

Office Action issued on Aug. 10, 2022 in corresponding Chinese Application No. 202010575951.7, 8 pages (including partial English translation).

Office Action issued on May 6, 2023, in corresponding Chinese Application No. 202010575951.7, 17 pages.

Liu et al., "University Physics", Aviation Industry Press, ISBN 7-80134-921-0, 2001, 8 pages (with partial English translation).

Jacobson et al., "Great Britain Photography Tutorials", The United Kingdom The Course of Photography, Focal Press, ISBN7-80606-488-5, 2000, 14 pages.

* cited by examiner

--Prior Art--

100

DISPLAY PANEL AND DISPLAY APPARATUS

CROSS REFERENCE TO RELATED APPLICATION

The present application is a continuation of International Application No. PCT/CN2021/077556 filed on Feb. 24, 2021, which claims the benefit of priority to Chinese Patent Application No. 202010575951.7 filed on Jun. 22, 2020, both of which are incorporated herein by reference in their entireties.

TECHNICAL FIELD

The present application relates to the field of display, and particularly to a display panel and a display apparatus.

BACKGROUND

The organic light emitting diode (OLED) display panel has the advantages of high color gamut, flexibility and fast response speed and the like, and its market share is increasing year by year. User's requirement for the display effect of OLED panel is also getting higher and higher. Nonetheless, for the OLED display panel, since the thickness of each film layer in the device and encapsulation fluctuates continuously with the evaporation cycles, the non-uniform thickness of the film layer will aggravate the discreteness of the viewing angle characteristics of the OLED display panel, causing the OLED display panel to have problems such as appearing cyan and pink at viewing angles.

Therefore, a new display panel and a new display apparatus is urgently needed.

SUMMARY

The embodiments of the present application provide a display panel and a display apparatus, aiming to improve the display effect of the display panel.

The embodiments of a first aspect of the present application provides a display panel, and the display panel includes: a substrate; a light emitting unit located on the substrate; and one or more combinational structure layers located on a side of the light emitting unit away from the substrate, each of the combinational structure layers includes a first structure layer, a second structure layer and a third structure layer, a refractive index of the first structure layer is greater than a refractive index of the second structure layer, and the refractive index of the second structure layer is greater than a refractive index of the third structure layer.

According to the embodiments of the first aspect of the present application, the refractive index of the first structure layer is N1, the refractive index of the second structure layer is N2, the refractive index of the third structure layer is N3, and N1, N2 and N3 satisfy: $N2=\sqrt{N1\times N3}$.

According to any one of the above embodiments of the first aspect of the present application, the display panel further includes an encapsulation layer stacked at the side of the light emitting unit away from the substrate, and the encapsulation layer includes at least one of the combinational structure layers.

According to any one of the above embodiments of the first aspect of the present application, the display panel further includes a touch layer stacked at a side of the encapsulation layer away from the light emitting unit, and the touch layer includes at least one of the combinational structure layers.

According to any one of the above embodiments of the first aspect of the present application, the display panel further includes a touch layer, the encapsulation layer includes a part of one of the combinational structure layers, and the touch layer includes another part of the one of the combinational structure layers.

The embodiments of a second aspect of the present application provides a display apparatus including the display panel of any one of the embodiments described above.

According to the embodiments of the present application, the display panel includes the substrate, the light emitting unit and the combinational structure layer. The light emitted by the light emitting unit exits the display panel via the combinational structure layer. The combinational structure layer includes the first structure layer, the second structure layer and the third structure layer that are stacked. The second structure layer is arranged between the first structure layer and the third structure layer, and the refractive index of the second structure layer is between the refractive index of the first structure layer and the refractive index of the third structure layer. Both of the contact interface between the first structure layer and the second structure layer and the contact interface between the second structure layer and the third structure layer reflect the light emitted by the light emitting unit, and the light reflected by the contact interface between the second structure layer and the third structure layer will interfere with the light reflected by the contact interface between the first structure layer and the second structure layer, weakening the reflection effect of the contact interface between the first structure layer and the second structure layer. Therefore, the thickness of the first structure layer will not have a great influence on the viewing angle characteristics, the color shift of viewing angles or the uneven color rendering caused by the non-uniform thickness of the first structure layer is reduced or even eliminated, and the display effect of the display panel is improved.

BRIEF DESCRIPTION OF THE DRAWINGS

Other features, objects, and advantages of the present application will become more apparent by reading the following detailed description of non-limiting embodiments with reference to the accompanying drawings, in which the same or similar reference numerals represent the same or similar features. The accompanying drawings are not drawn to actual scale.

FIG. 17 shows the trajectory diagram of white light under different thicknesses of the first inorganic film layer in Example 1; and FIG. 18 shows the trajectory diagram of white light under different thicknesses of the first inorganic film layer in Comparative Example 1.

DETAILED DESCRIPTION

Features and exemplary embodiments of various aspects of the present application will be described in detail below. In order to make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

The organic light emitting diode (OLED) display panel has the advantages of high color gamut, flexibility and fast response speed and the like, and its market share is increasing year by year. User's requirement for the display effect of OLED panel is also getting higher and higher.

In the OLED display panel, the thickness of each film layer in the light emitting device and encapsulation is non-uniform, especially when the thickness of various film layers in the encapsulation is non-uniform, the discreteness of the viewing angle characteristics of the OLED display panel will be aggravated, causing the display panel to have problems such as appearing cyan and pink at viewing angles.

In the actual manufacturing process of the display panel, although the yield loss can be recovered to a certain extent by improving the uniformity of the film layers and monitoring the chromaticity, the discreteness still cannot be fundamentally solved.

Figure 1:
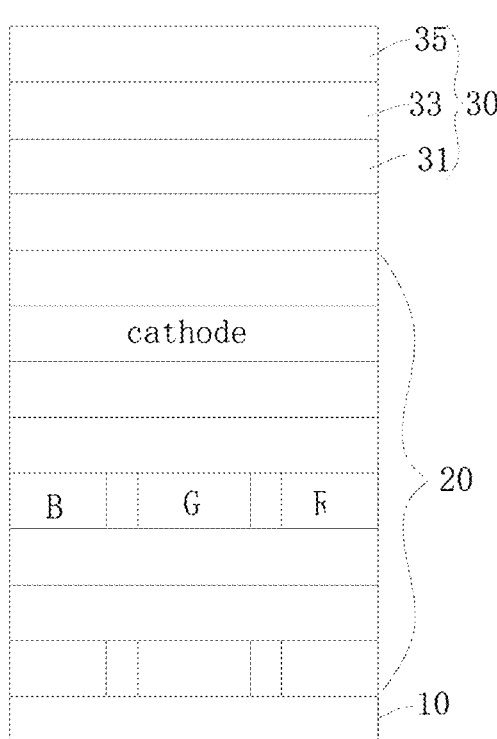
FIG. 1 shows a partial cross-sectional view of a display panel.

As shown in FIG. 1, a typical OLED display panel 100 includes a light emitting unit 20 and an encapsulation layer 30 located on the light emitting unit 20, and the encapsulation layer 30 includes a first inorganic film layer 31, an organic film layer 33 and a second inorganic film layer 35 that are stacked. The contact interface between the first inorganic film layer 31 and the organic film layer 33 reflects the light emitted by the light emitting unit 20. If the thickness of the first inorganic film layer 31 is non-uniform, the light reflected by the contact interface between the first inorganic film layer 31 and the organic film layer 33 is non-uniform. In the display panel 100, the thickness fluctuation of the first inorganic film layer 31 in the encapsulation layer 30 located on the light emitting unit 22 has a significant influence on the trajectory of white light and the color shift of viewing angles, which increases the probability of appearing pink at small viewing angle and the probability of appearing cyan at large viewing angle and causes yield loss. Therefore, it is necessary to improve the display panel 100 to reduce the sensitivity of the viewing angle characteristics to the thickness of film layer.

In order to solve the above problems, the embodiments of the present application provide a display panel 100 and a display apparatus. The display panel according to the embodiments of the present application includes: a substrate 10; a light emitting unit 20 located on the substrate 10; and one or more combinational structure layers located on a side of the light emitting unit 20 away from the substrate, each of the combinational structure layers includes a first structure layer, a second structure layer and a third structure layer, a refractive index of the first structure layer is greater than a refractive index of the second structure layer, and the refractive index of the second structure layer is greater than a refractive index of the third structure layer.

Optionally, the first structure layer, the second structure layer and the third structure layer in the combinational structure layer are arranged in sequence along the direction from the substrate to the light emitting unit.

According to the embodiments of the present application, the display panel includes the substrate, the light emitting unit and the combinational structure layer. The light emitted by the light emitting unit exits the display panel via the combinational structure layer. The combinational structure layer includes the first structure layer, the second structure layer and the third structure layer that are stacked. The second structure layer is arranged between the first structure layer and the third structure layer, and the refractive index of the second structure layer is between the refractive index of the first structure layer and the refractive index of the third structure layer. Both of the contact interface between the first structure layer and the second structure layer and the contact interface between the second structure layer and the third structure layer reflect the light emitted by the light emitting unit, and the light reflected by the contact interface between the second structure layer and the third structure layer will interfere with the light reflected by the contact interface between the first structure layer and the second structure layer, weakening the reflection effect of the contact interface between the first structure layer and the second structure layer. Therefore, the thickness of the first structure layer will not have a great influence on the viewing angle characteristics, the color shift of viewing angles or the uneven color rendering caused by the non-uniform thickness of the first structure layer is reduced or even eliminated, and the display effect of the display panel is improved.

In some embodiments, the refractive index of the first structure layer is N1, the refractive index of the second structure layer is N2, the refractive index of the third structure layer is N3, and N1, N2 and N3 satisfy: $N2=\sqrt{N1 \times N3}$.

If the refractive indices of the first structure layer, the second structure layer and the third structure layer satisfy the above equation, the transmittances of the first structure layer, the second structure layer and the third structure layer can be guaranteed, the light transmittance of the combinational structure layer is increased, and the power consumption of the display panel is reduced.

In some embodiments, the display panel further includes an encapsulation layer stacked at the side of the light emitting unit away from the substrate. The encapsulation layer may include at least one of the combinational structure layers.

Optionally, the display panel further includes a touch layer stacked at a side of the encapsulation layer away from the substrate. The touch layer may include at least one of the combinational structure layers.

In some other optional embodiments, the display panel includes the encapsulation layer and the touch layer, the encapsulation layer includes a part of one of the combinational structure layers, and the touch layer includes another part of the one of the combinational structure layers. That is, the encapsulation layer and the touch layer respectively include different structure layers in the same combinational structure layer.

Therefore, according to the above embodiment, the combinational structure layer may be arranged at various locations, for example, the combinational structure layer by located in the encapsulation layer; additionally/alternatively, the combinational structure layer may be located in the touch layer; additionally/alternatively, at lease a part of the combinational structure layer is arranged in the encapsulation layer, and another part of the same combinational structure layer is arranged in the touch layer.

Embodiments of the display panel 100 and the display apparatus will be described below with reference to the accompanying drawings.

The embodiments of the present application provide a display panel 100 which may be an OLED display panel 100.

Figure 2:
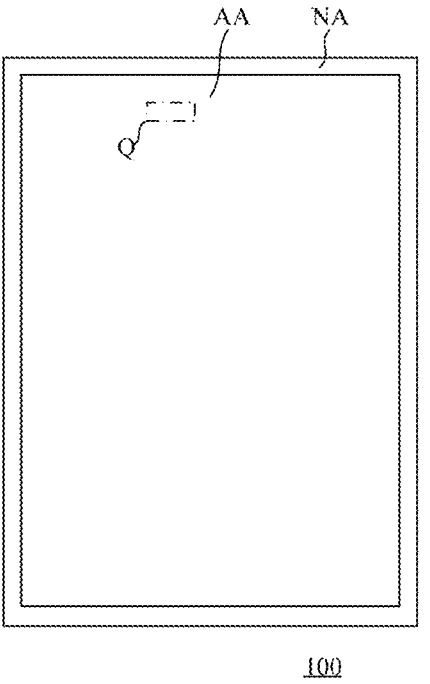
FIG. 2 shows a top view of a display panel according to an embodiment of the present application.
Figure 3:
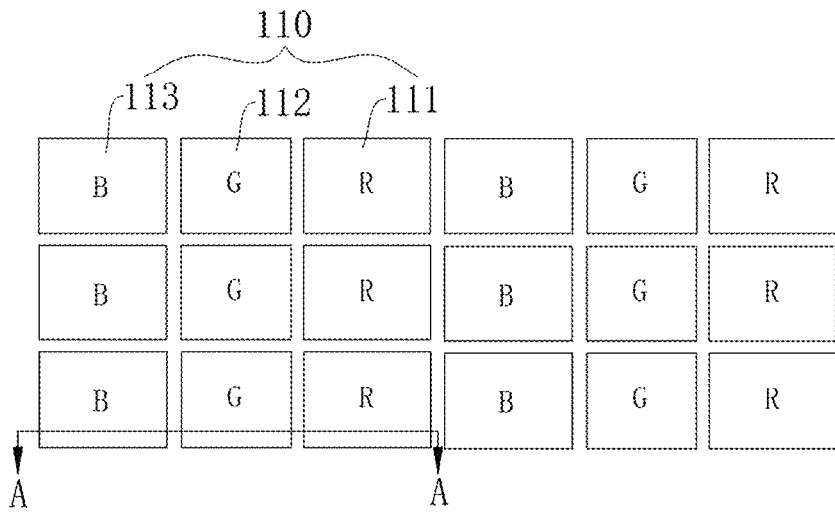
FIG. 3 shows a partial enlarged view of the area Q in FIG. 2 according to an embodiment.

FIG. 2 shows a top view of the display panel 100 according to an embodiment of the present application, and FIG. 3 shows a partial enlarged view of the area Q in FIG. 2 according to an embodiment.

As shown in FIG. 2, according to the embodiments of the present application, the display panel 100 includes a display area AA and a non-display area NA. In other embodiments, the display panel 100 may be configured for full-screen display and includes the display area AA. As shown in FIG. 3, the display panel 100 includes a plurality of sub-pixels 110, including, for example, the red sub-pixels 111, the blue sub-pixels 113 and the green sub-pixels 112. In other embodiments, the plurality of sub-pixels 110 further include, for example, yellow sub-pixels 110.

Figure 4:
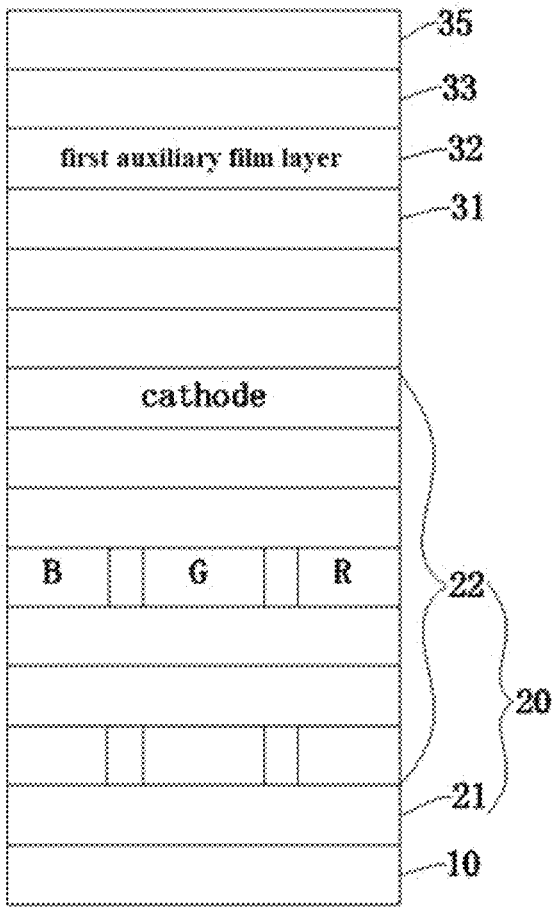
FIG. 4 shows a cross-sectional view taken along A-A in FIG. 3 according to an embodiment.

Further referring to FIG. 4 which shows a cross-sectional view taken along A-A in FIG. 3 according to an embodiment. As shown in FIG. 4, according to the embodiments of the present application, the display panel 100 includes: a substrate 10; a light emitting unit 20 located on the substrate 10; and an encapsulation layer 30 located on the light emitting unit 20, the encapsulation layer 30 includes a first inorganic film layer 31, an organic film layer 33 and a second inorganic film layer 35 that are stacked on the light emitting unit 20.

Optionally, at least one of the combinational structure layers is arranged in the encapsulation layer 30. That is, the encapsulation layer 30 includes the combinational structure layer.

For example, the encapsulation layer 30 further includes a first auxiliary film layer 32 located between the first inorganic film layer 31 and the organic film layer 33, and in a same combinational structure layer, the first structure layer is the first inorganic film layer 31, the second structure layer is the first auxiliary film layer 32, the third structure layer is the organic film layer 33. That is, the refractive index of the first inorganic film layer 31 is greater than the refractive index of the first auxiliary film layer 32, and the refractive index of the first auxiliary film layer 32 is greater than the refractive index of the organic film layer 33.

According to the embodiments of the present application, the display panel 100 includes the substrate 10, the light emitting unit 20 and the encapsulation layer 30. The light emitted by the light emitting unit 20 exits the display panel 100 via the encapsulation layer 30. The encapsulation layer 30 includes the first inorganic film layer 31, the organic film layer 33 and the second inorganic film layer 35 that are stacked. The first auxiliary film layer 32 is arranged between the first inorganic film layer 31 and the organic film layer 33, and the refractive index of the first auxiliary film layer 32 is between the refractive index of the first inorganic film layer 31 and the refractive index of the organic film layer 33. Both of the contact interface between the first inorganic film layer 31 and the first auxiliary film layer 32 and the contact interface between the first auxiliary film layer 32 and the organic film layer 33 reflect the light emitted by the light emitting unit 20, and the light reflected by the contact interface between the first auxiliary film layer 32 and the organic film layer 33 will interfere with the light reflected by the contact interface between the first inorganic film layer 31 and the first auxiliary film layer 32, weakening the reflection effect of the contact interface between the first inorganic film layer 31 and the first auxiliary film layer 32. Therefore, the influence of the non-uniform thickness of the first inorganic film layer 31 on the viewing angle characteristics can be reduced, the color shift of viewing angles or the uneven color rendering caused by the non-uniform thickness of the first inorganic film layer 31 is reduced or even eliminated, and the display effect of the display panel 100 is improved.

In some optional embodiments, a light extraction layer and a light modulation layer are further arranged between the light emitting unit 20 and the encapsulation layer 30, for example, the light modulation layer includes a LiF layer, so as to improve the light extraction efficiency of the display panel 100.

The substrate 10 may be made of a light-transmitting material such as glass, Polyimide (PI). For example, the light emitting unit 20 includes a driving device 21 and a light emitting device 22, and the driving device 21 includes, for example, a pixel driving circuit and the like. The light emitting device 22 includes, for example, a first electrode layer, a light emitting structure layer, and a second electrode layer.

In some optional embodiments, according to design requirements, the light emitting structure layer may further include at least one of a hole inject layer, a hole transport layer, an electron inject layer or an electron transport layer.

The first electrode layer may be a light transmitting electrode layer and include an indium tin oxide (Indium Tin Oxide, ITO) layer or an indium zinc oxide layer. Alternatively, the first electrode layer may be a reflective electrode layer including a first light transmitting conductive layer, a reflective layer located on the first light transmitting conductive layer, and a second light transmitting conductive layer located on the reflective layer. The first light transmitting conductive layer and the second light transmitting conductive layer may be ITO, indium zinc oxide and the like, and the reflective layer may be a metal layer, for example, made of silver. The second electrode layer may include a magnesium-silver alloy layer.

Exemplarily, the display panel 100 may further include a polarizer and a cover plate located on the encapsulation layer 30; alternatively, the cover plate may be directly arranged on the encapsulation layer 30 without the polarizer. In some other optional embodiments, touch electrodes may be further arranged on the encapsulation layer 30.

The first auxiliary film layer 32 may be a single-layer structure layer. Alternatively, in some other optional embodiments, the first auxiliary film layer 32 may be a composite structure layer.

Figure 5:
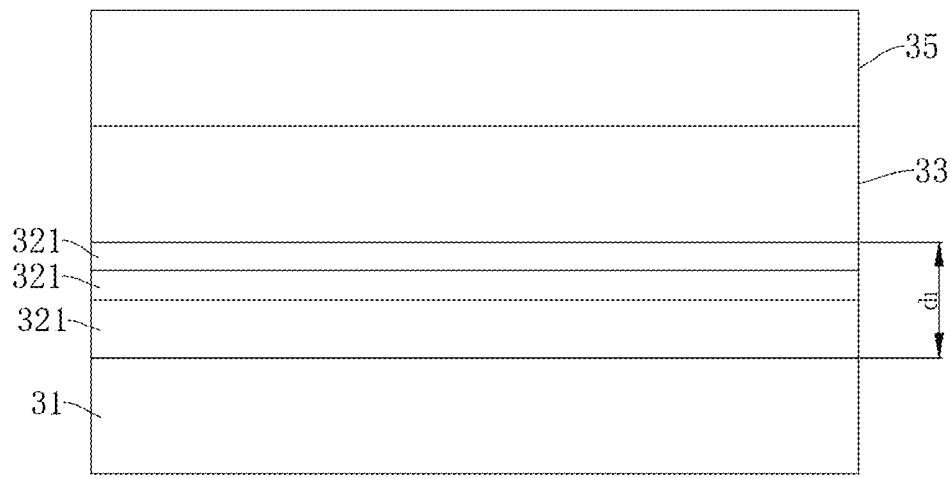
FIG. 5 shows a schematic structural diagram of an encapsulation layer in a display panel according to an embodiment.

FIG. 5 shows a schematic structural diagram of the encapsulation layer 30 according to another embodiment of the present application. As shown in FIG. 5, if the first auxiliary film layer 32 is a composite structure layer, the first auxiliary film layer 32 includes N first film layers 321 that are stacked, and in the direction from the first inorganic film layer 31 to the organic film layer 33, the refractive index of an i-th first film layer 321 is greater than the refractive index of the $(i+1)$-th first film layer 321, N is a positive integer greater than or equal to 2, and $i=1, 2, 3, \ldots, N-1$. That is, in the direction from the first inorganic film layer 31 to the organic film layer 33, the refractive index of each first film layer 321 in the first auxiliary film layer 32 tends to decrease.

In these optional embodiments, the first auxiliary film layer 32 is configured as a composite structure layer, and with a plurality of the first film layers 321, the transmittance-increasing effect of the first auxiliary film layer 32 can be further improved, so that the reflection effect of the contact interface between the first inorganic film layer 31 and the first auxiliary film layer 32 is weakened, the color shift of viewing angles or the uneven color rendering caused by the non-uniform thickness of the first inorganic film layer 31 is reduced or even eliminated, and the display effect of the display panel 100 is further improved.

If the first auxiliary film layer 32 includes a plurality of the first film layers 321, the materials of the plurality of the first film layers 321 may be the same or different. In some optional embodiments, the first film layers 321 are inorganic material layers; alternatively, the first film layers 321 are organic material layers; alternatively, a part of the plurality of the first film layers 321 are organic material layers, and another part of the plurality of the first film layers 321 are inorganic material layers. Users can select appropriate inorganic materials or organic materials according to actual manufacturing requirements to form the plurality of the first film layers 321.

If the first auxiliary film layer 32 includes a plurality of the first film layers 321, the thicknesses of the plurality of first film layers 321 may be the same or different.

The thickness of the first auxiliary film layer 32 may be set in a variety of manners. In some optional embodiments, the thickness $d_1$ of the first auxiliary film layer 32 satisfies:

$$d_1 = (2k_1 - 1)\lambda/4n_1 \tag{1}$$

in which $n_1$ is the refractive index of the first auxiliary film layer 32, $\lambda$ is the wavelength of visible light, and $k_1$ is a positive integer.

Figure 6:
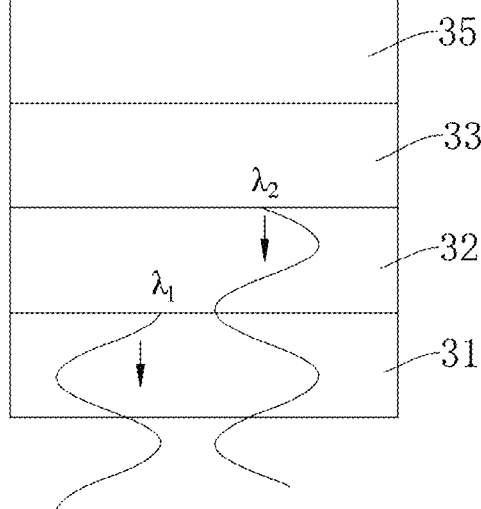
FIG. 6 shows a schematic waveform diagram of a light.

FIG. 6 shows a schematic waveform diagram of a light. The influence of the first auxiliary film layer 32 on the display effect of the display panel 100 under a condition that the thickness $d_1$ of the first auxiliary film layer 32 satisfies the above equation (1) will be described below with reference to FIG. 6.

Assuming that the contact interface between the first inorganic film layer 31 and the first auxiliary film layer 32 reflects the light emitted by the light emitting unit 20 to form a first light ray having a first waveform $\lambda_1$, and the contact interface between the first auxiliary film layer 32 and the organic film layer 33 reflects the light emitted by the light emitting unit 20 to form a second light ray having a second waveform $\lambda_2$.

As shown in FIG. 6, if the thickness $d_1$ of the first auxiliary film layer 32 satisfies the above equation (1), the first waveform $\lambda_1$ and the second waveform $\lambda_2$ cancel each other out, and the peak of the first waveform $\lambda_1$ overlaps the trough of the second waveform $\lambda_2$, therefore the second light ray can eliminate the first light ray, so that the reflection effect of the contact interface between the first inorganic film layer 31 and the first auxiliary film layer 32 is weakened or even eliminated, the color shift of viewing angles or the uneven color rendering caused by the non-uniform thickness of the first inorganic film layer 31 is reduced or even eliminated, and the display effect of the display panel 100 is further improved.

In some optional embodiments, if the first auxiliary film layer 32 is a composite structure layer and includes N first film layers 321 that are stacked, the thickness of each first film layer 321 satisfies the above equation, the display effect of the display panel 100 can be further improved.

In equation (1), $\lambda$ may be the wavelength of visible light, so that the visible light reflected by the contact interface between the first inorganic film layer 31 and the first auxiliary film layer 32 can be eliminated.

In some optional embodiments, the value of 2 is 470 nm~780 nm. The light emitted by the display panel 100 is generally red light, green light and blue light, and the wavelength of which is in the range of 470 nm~780 nm. If the value of 2 is 470 nm~780 nm, the light reflected by the contact interface between the first inorganic film layer 31 and the first auxiliary film layer 32 can be better eliminated, and the display effect is improved.

In some optional embodiments, $\lambda$ is the wavelength of green light; alternatively, $\lambda$ is the wavelength of red light; alternatively, $\lambda$ is the wavelength of blue light. If the discreteness of viewing angles of the display panel 100 is mainly caused by the green sub-pixels 112, $\lambda$ can be the wavelength of green light, so that the green light reflected by the contact interface between the first inorganic film layer 31 and the first auxiliary film layer 32 can be better eliminated, and the display effect is improved.

If the discreteness of viewing angles of the display panel 100 is mainly caused by the red sub-pixels 111, $\lambda$ can be the wavelength of red light, so that the red light reflected by the contact interface between the first inorganic film layer 31 and the first auxiliary film layer 32 can be better eliminated, and the display effect is improved.

If the discreteness of viewing angles of the display panel 100 is mainly caused by the blue sub-pixels 113, 2 can be the wavelength of blue light, so that the blue light reflected by the contact interface between the first inorganic film layer 31 and the first auxiliary film layer 32 can be better eliminated, and the display effect is improved.

In some optional embodiments, the thickness $d_1$ of the first auxiliary film layer 32 is 60 nm~120 nm. Alternatively, the thickness $d_1$ of the first auxiliary film layer 32 is 90 nm. If the value of the thickness of the first auxiliary film layer 32 is within the above range, the reflection-reducing effect of the first auxiliary film layer 32 is more obvious, and a good display effect can be guaranteed.

Figure 7:
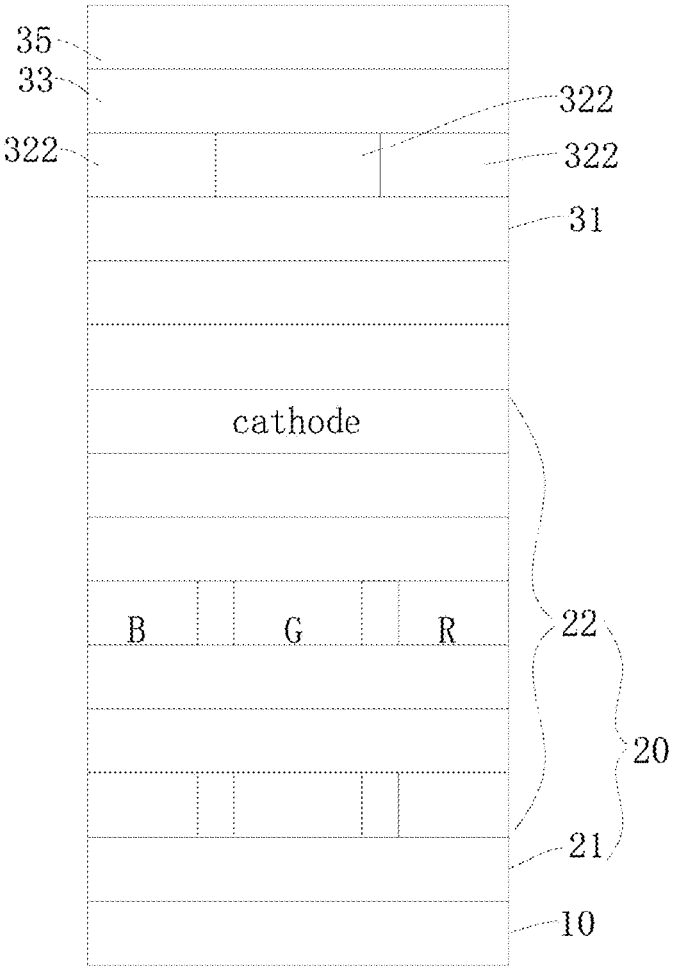
FIG. 7 shows a cross-sectional view taken along A-A in FIG. 3 according to another embodiment in which the first auxiliary film layer 32 includes a plurality of first auxiliary sub-layers 322 arranged in an array.

As shown in FIG. 7, in some other optional embodiments, the first auxiliary film layer 32 includes a plurality of first auxiliary sub-layers 322 arranged in an array, each of the first auxiliary sub-layers 322 corresponds to the sub-pixels 110 of the display panel 100, and the thicknesses of the first auxiliary sub-layers 322 corresponding to the sub-pixels 110 with a same color are the same.

For example, in some optional embodiments, the display panel 100 includes the red sub-pixels 111, the green sub-pixels 112 and the blue sub-pixels 113, the plurality of first auxiliary sub-layers 322 are arranged correspondingly to the red sub-pixels 111, the green sub-pixels 112 and the blue sub-pixels 113, respectively, and the thicknesses of the first auxiliary sub-layers 322 corresponding to the sub-pixels 110 with a same color are the same.

The light emitting units 20 corresponding to the red sub-pixels 111, the green sub-pixels 112 and the blue sub-pixels 113 emit red light, green light and blue light, respectively, and the wavelengths of red light, green light and blue light are different. The contact interface between the first inorganic film layer 31 and the first auxiliary film layer 32 reflects the light emitted by the light emitting unit 20 to form the first light ray, the waveforms of the first light rays formed correspondingly to the sub-pixels 110 with different colors are different, and the waveforms of the first light rays formed correspondingly to the sub-pixels 110 with a same color are the same. The contact interface between the first auxiliary film layer 32 and the organic film layer 33 reflects the light emitted by the light emitting unit 20 to form the second light ray.

In these optional embodiments, the thicknesses of the first auxiliary sub-layers 322 corresponding to the sub-pixels 110 with a same color are the same, so that for the sub-pixels 110 with the same color, the distances between adjacent two peaks in the waveforms of the second light ray and the first light ray are the same and the eliminating effect of the second light ray to the first light ray are the same, therefore the reflection effect of the contact interface between the first inorganic film layer 31 and the first auxiliary film layer 32 can be further improved, the color shift of viewing angles or the uneven color rendering caused by the non-uniform thickness of the first inorganic film layer 31 is reduced or even eliminated, and the display effect of the display panel 100 is improved.

Optionally, if the first auxiliary film layer 32 is a composite structure layer and includes a plurality of the first film layers 321 that are stacked, the first auxiliary sub-layers 322 may be composite structure layers, and each of the first auxiliary sub-layers 322 includes a plurality of the first film layers 321 that are stacked.

In some optional embodiments, the thickness of the first auxiliary sub-layer 322 and the wavelength of the light emitted by its corresponding sub-pixel 110 are in a linear relationship.

In these optional embodiments, by appropriately setting the thickness of the first auxiliary sub-layer 322, for example, obtaining the thickness of each of the first auxiliary sub-layers 322 through the above equation (1), and selecting λ as the wavelength of the light emitted by the sub-pixel 110 corresponding to the first auxiliary sub-layer 322, the second light ray and the first light ray can be canceled, so that the color shift of viewing angles or the uneven color rendering caused by the non-uniform thickness of the first inorganic film layer 31 is reduced or even eliminated, and the display effect of the display panel 100 is improved.

In some optional embodiments, the refractive index of the first inorganic film layer 31 is 1.7~1.8, the refractive index of the first auxiliary film layer 32 is 1.6~1.7, and the refractive index of the organic film layer 33 is 1.4~1.6. In these optional embodiments, the refractive indices of the first inorganic film layer 31, the first auxiliary film layer 32 and the organic film layer 33 are within the above ranges, and the refractive index of the first inorganic film layer 31 is greater than the refractive index of the first auxiliary film layer 32, so that the first inorganic film layer 31 can reduce water and oxygen intrusion and the first auxiliary film layer 32 can relieve the stress on the encapsulation layer 30, therefore the bending resistance of the display panel 100 is improved. The refractive index of the first auxiliary film layer 32 is greater than the refractive index of the organic film layer 33, so that the organic film layer 33 can further improve the bending resistance of the display panel 100.

The first inorganic film layer 31 may be manufactured in a variety of manners, for example, the first inorganic film layer 31 can be formed by chemical vapor deposition and/or atomic layer deposition. The manufacturing process through chemical vapor deposition and/or atomic layer deposition is well developed and has good manufacturing effect.

The material of the first auxiliary film layer 32 may be set in a variety of manners. In some optional embodiments, the first auxiliary film layer 32 is an inorganic material layer, so that the first auxiliary film layer 32 can be manufactured by a same process with the first inorganic film layer 31. In the manufacturing process of the display panel 100, after the first inorganic film layer 31 is formed, the first auxiliary film layer 32 can be subsequently formed without moving the equipment for chemical deposition and/or atomic layer deposition, the manufacturing process is simplified and the manufacturing efficiency of the display panel 100 is improved.

Optionally, the first auxiliary film layer 32 and the first inorganic film layer 31 have a same composition, so that the first auxiliary film layer 32 can be manufactured by a same manufacturing process with the first inorganic film layer 31. In these optional embodiments, the compositions of the first auxiliary film layer 32 and the first inorganic film layer 31 are the same, and in the manufacturing process of the display panel 100, after the first inorganic film layer 31 is formed, the first auxiliary film layer 32 can be subsequently formed by merely adjusting the parameters of chemical deposition and/or atomic layer deposition, the manufacturing process can be further simplified and the manufacturing efficiency of the display panel 100 is improved.

In some optional embodiments, the material of the first auxiliary film layer 32 includes one or more of silicon nitride and silicon oxynitride.

In some optional embodiments, the material of the first inorganic film layer 31 includes one or more of silicon nitride and silicon oxynitride.

Figure 8:
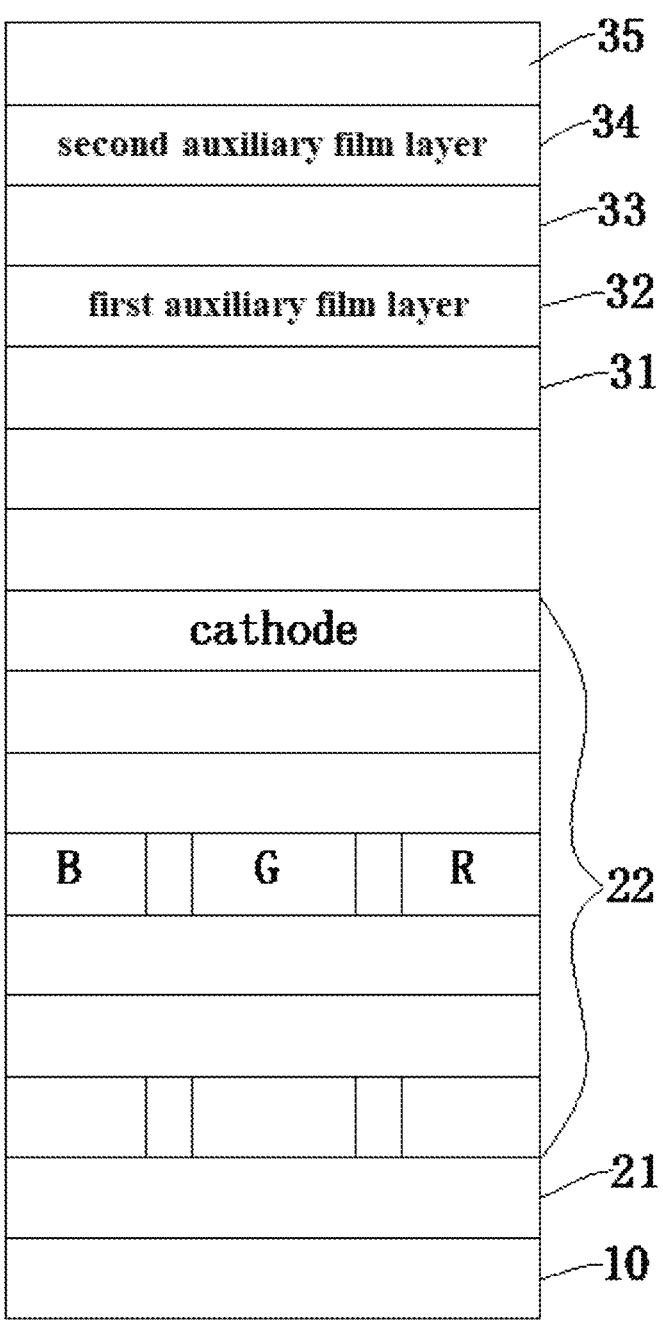
FIG. 8 shows a cross-sectional view taken along A-A in FIG. 3 according to yet another embodiment in which the second auxiliary film layer 34 is arranged between the organic film layer 33 and the second inorganic film layer 35.

As shown in FIG. 8, in some optional embodiments, the encapsulation layer 30 further includes the second inorganic film layer 35 located on the organic film layer 33, the second auxiliary film layer 34 is arranged between the organic film layer 33 and the second inorganic film layer 35, and in a same combinational structure layer, the first structure layer is the second inorganic film layer 35, the second structure layer is the second auxiliary film layer 34, the third structure layer is the organic film layer 33. That is, the refractive index of the second auxiliary film layer 34 is greater than the refractive index of the organic film layer 33, and the refractive index of the second inorganic film layer 35 is greater than the refractive index of the second auxiliary film layer 34.

In these optional embodiments, both of the contact interface between the organic film layer 33 and the second auxiliary film layer 34 and the contact interface between the second auxiliary film layer 34 and the second inorganic film layer 35 reflect the light emitted by the light emitting unit 20, and the light reflected by the contact interface between the second auxiliary film layer 34 and the second inorganic film layer 35 will interfere with the light reflected by the contact interface between the organic film layer 33 and the second auxiliary film layer 34, weakening the reflection effect of the contact interface between the organic film layer 33 and the second auxiliary film layer 34. Therefore, the thickness of the organic film layer 33 will not have a great influence on the viewing angle characteristics, the color shift of viewing angles or the uneven color rendering caused by the non-uniform thickness of the organic film layer 33 is reduced or even eliminated, and the display effect of the display panel 100 is improved.

Optionally, one of the combinational structure layers may be arranged in the encapsulation layer 30. For example, in a same combinational structure layer, the first structure layer is the first inorganic film layer 31, the second structure layer is the first auxiliary film layer 32, the third structure layer is the organic film layer 33; alternatively, in a same combinational structure layer, the first structure layer is the second inorganic film layer 35, the second structure layer is the second auxiliary film layer 34, the third structure layer is the organic film layer 33.

Alternatively, two of the combinational structure layers may be arranged in the encapsulation layer 30. For example, in one of the two combinational structure layers, the first structure layer is the first inorganic film layer 31, the second structure layer is the first auxiliary film layer 32, the third structure layer is the organic film layer 33. In the other one of the two combinational structure layers, the first structure layer is the second inorganic film layer 35, the second structure layer is the second auxiliary film layer 34, the third structure layer is the organic film layer 33.

In some optional embodiments, the second auxiliary film layer 34 is an inorganic material layer. Moreover, the second auxiliary film layer 34 may be formed by deposition, so that the second auxiliary film layer 34 can be made thin enough, the second inorganic film layer 35 can be formed directly after the second auxiliary film layer 34 is formed, and the manufacturing process of the display panel can be simplified.

Optionally, the material of the second auxiliary film layer 34 includes one or more of silicon nitride and silicon oxynitride.

The second auxiliary film layer 34 may be a single-layer structure layer. Alternatively, in some other optional embodiments, the second auxiliary film layer 34 is a composite structure layer.

Figure 9:
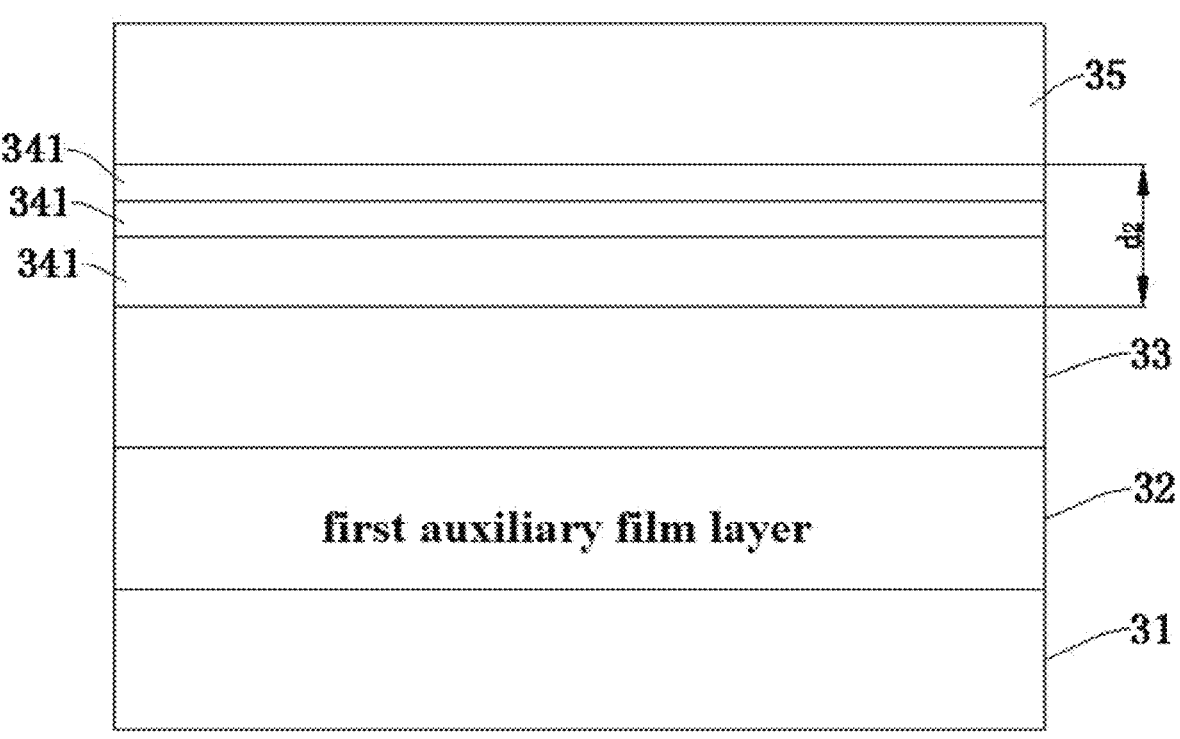
FIG. 9 shows a schematic structural diagram of an encapsulation layer in a display panel according to another embodiment in which the second auxiliary film layer 34 includes a plurality of second film layers 341.

As shown in FIG. 9, if the second auxiliary film layer 34 is a composite structure layer, the second auxiliary film layer 34 includes M second film layers 341 that are stacked, and in the direction from the organic film layer 33 to the second inorganic film layer 35, the refractive index of the j-th second film layer 341 is less than the refractive index of a (j+1)-th second film layer 341, M is a positive integer greater than or equal to 2, and j=1, 2, 3, . . . , M−1.

In these optional embodiments, the second auxiliary film layer 34 is configured as a composite structure layer, and with a plurality of the second film layers 341, the transmittance-increasing effect of the second auxiliary film layer 34 can be further improved, so that the reflection effect of the contact interface between the organic film layer 33 and the second auxiliary film layer 34 is weakened, the color shift of viewing angles or the uneven color rendering caused by the non-uniform thickness of the organic film layer 33 is reduced or even eliminated, and the display effect of the display panel 100 is further improved.

If the second auxiliary film layer 34 includes a plurality of the second film layers 341, the thicknesses of the plurality of the second film layers 341 may be the same or different.

In some optional embodiments, the thickness $d_2$ of the second auxiliary film layer 34 satisfies:

$$d_2 = (2k_2 - 1)\lambda/4n_2 \tag{2}$$

in which $n_2$ is the refractive index of the second auxiliary film layer 34, $\lambda$ is the wavelength of visible light, and $k_2$ is a positive integer.

The influence of the second auxiliary film layer 34 on the display effect of the display panel 100 under a condition that the thickness $d_2$ of the second auxiliary film layer 34 satisfies the above equation (2) will be described below with reference to FIG. 10.

Figure 10:
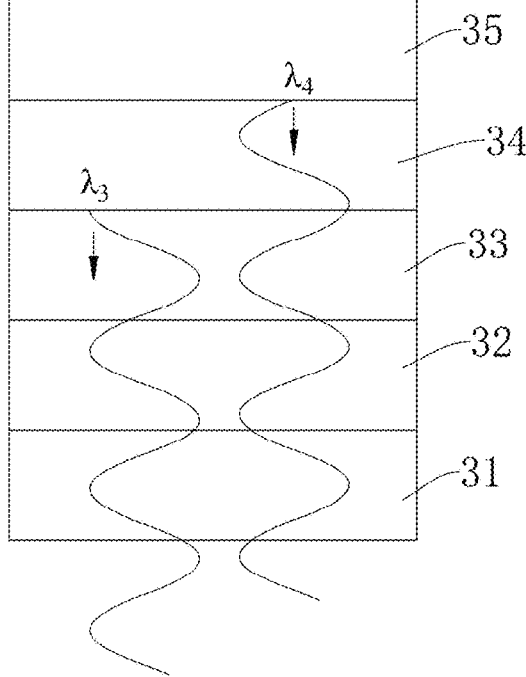
FIG. 10 shows a schematic waveform diagram of another light.

As shown in FIG. 10, the contact interface between the organic film layer 33 and the second auxiliary film layer 34 reflects the light emitted by the light emitting unit 20 to form a third light ray having a third waveform $k_3$, and the contact interface between the second auxiliary film layer 34 and the second inorganic film layer 35 reflects the light emitted by the light emitting unit 20 to form a fourth light ray having a fourth waveform $\lambda_4$.

In these optional embodiments, if the thickness $d_2$ of the second auxiliary film layer 34 satisfies the above equation (2), the fourth waveform $\lambda_4$ and the third waveform $\lambda_3$ cancel each other out, and the peak of the fourth waveform $\lambda_4$ overlaps the trough of the third waveform $k_3$, therefore the fourth light ray can eliminate the third light ray, so that the reflection effect of the contact interface between the organic film layer 33 and the second auxiliary film layer 34 is weakened or even eliminated, the color shift of viewing angles or the uneven color rendering caused by the non-uniform thickness of the organic film layer 33 is reduced or even eliminated, and the display effect of the display panel 100 is further improved.

In some optional embodiments, the value of 2 is 470 nm~780 nm. The light emitted by the display panel 100 is generally red light, green light and blue light, and the wavelength of which is in the range of 470 nm~780 nm. If the value of 2 is 470 nm~780 nm, the light reflected by the contact interface between the organic film layer 33 and the second auxiliary film layer 34 can be better eliminated, and the display effect is improved.

Optionally, $\lambda$ is the wavelength of green light; alternatively, $\lambda$ is the wavelength of red light; alternatively, $\lambda$ is the wavelength of blue light.

Optionally, the thickness $d_2$ of the second auxiliary film layer 34 is 60 nm~120 nm. If the value of the thickness of the second auxiliary film layer 34 is within the above range, the display panel 100 will not be too thick, and a good display effect can be guaranteed.

In some optional embodiments, if the second auxiliary film layer 34 is a composite structure layer and includes M second film layers 341 that are stacked, the thickness of each second film layer 341 satisfies the above equation (2), the display effect of the display panel 100 can be further improved.

Figure 11:
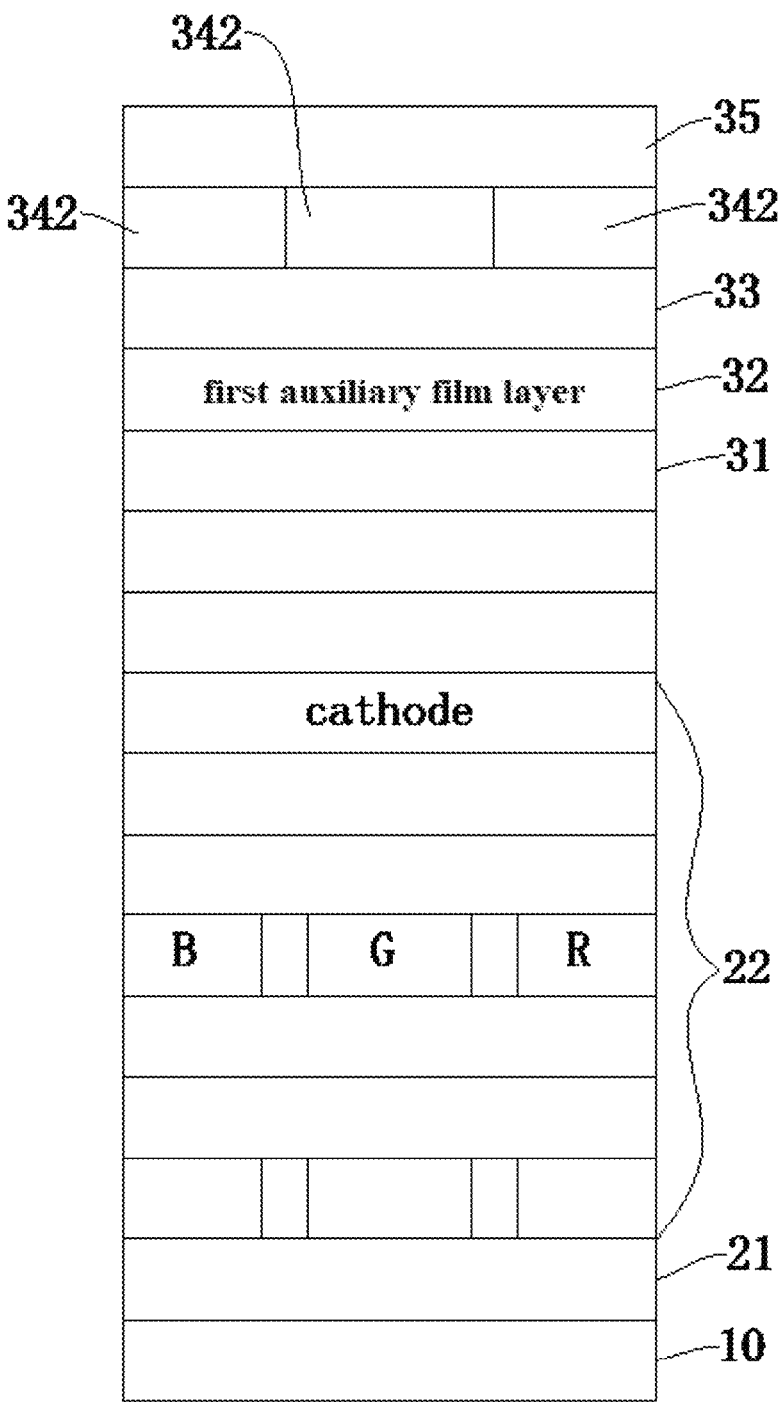
FIG. 11 shows a cross-sectional view taken along A-A in FIG. 3 according to yet another embodiment in which the second auxiliary film layer 34 includes a plurality of second auxiliary sub-layers 342 arranged in an array.

As shown in FIG. 11, in some other optional embodiments, the second auxiliary film layer 34 includes a plurality of second auxiliary sub-layers 342 arranged in an array, each of the second auxiliary sub-layers 342 corresponds to the sub-pixels 110 of the display panel 100, and the thicknesses of the second auxiliary sub-layers 342 corresponding to the sub-pixels 110 with a same color are the same.

For example, in some optional embodiments, the display panel 100 includes the red sub-pixels 111, the green sub-pixels 112 and the blue sub-pixels 113, the plurality of the second auxiliary sub-layers 342 are arranged correspondingly to the red sub-pixels 111, the green sub-pixels 112 and the blue sub-pixels 113, respectively, and the thicknesses of the second auxiliary sub-layers 342 corresponding to the sub-pixels 110 with a same color are the same.

The light emitting units 20 corresponding to the red sub-pixels 111, the green sub-pixels 112 and the blue sub-pixels 113 emit red light, green light and blue light, respectively, and the wavelengths of red light, green light and blue light are different. The waveforms of the third light rays formed correspondingly to the sub-pixels 110 with different colors are different, and the waveforms of the third light rays formed correspondingly to the sub-pixels 110 with a same color are the same.

In these optional embodiments, the thicknesses of the second auxiliary sub-layers 342 corresponding to the sub-pixels 110 with a same color are the same, so that for the sub-pixels 110 with the same color, the distances between adjacent two peaks in the waveforms of the third light ray and the fourth light ray are the same and the eliminating effect of the fourth light ray to the third light ray are the same, therefore the color shift of viewing angles or the uneven color rendering caused by the non-uniform thickness of the organic film layer 33 can be further reduced or even eliminated, and the display effect of the display panel 100 is improved.

Optionally, if the second auxiliary film layer 34 is a composite structure layer and includes a plurality of the second film layers 341 that are stacked, the second auxiliary sub-layers 342 may be composite structure layers, and each of the second auxiliary sub-layers 342 includes a plurality of the second film layers 341 that are stacked.

In some optional embodiments, the thickness of the second auxiliary sub-layer 342 and the wavelength of the light emitted by its corresponding sub-pixel 110 are in a linear relationship.

In these optional embodiments, by appropriately setting the thickness of the second auxiliary sub-layer 342, for example, obtaining the thickness of each of the second auxiliary sub-layers 342 through the above equation (2), and selecting λ as the wavelength of the light emitted by the sub-pixel 110 corresponding to the second auxiliary sub-layer 342, the fourth light ray and the third light ray can be canceled, so that the color shift of viewing angles or the uneven color rendering caused by the non-uniform thickness of the organic film layer 33 is reduced or even eliminated, and the display effect of the display panel 100 is improved.

Figure 12:
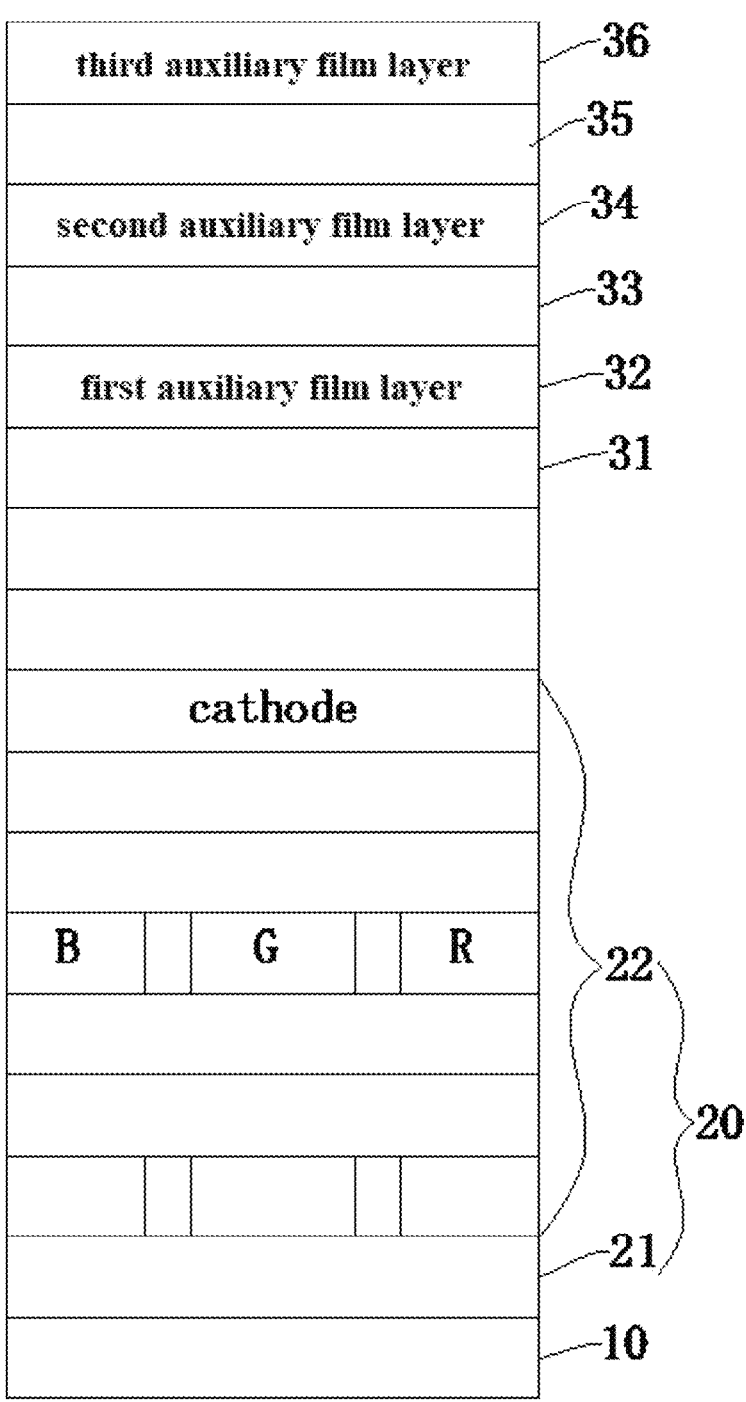
FIG. 12 shows a cross-sectional view taken along A-A in FIG. 3 according to yet another embodiment in which the third auxiliary film layer 36 is arranged on the second inorganic film layer 35.

As shown in FIG. 12, in some optional embodiments, the display panel 100 further includes the third auxiliary film layer 36 located on the second inorganic film layer 35, and the refractive index of the third auxiliary film layer 36 is less than the refractive index of the second inorganic film layer 35.

In these optional embodiments, both of the contact interface between the second inorganic film layer 35 and the third auxiliary film layer 36 and the surface of the third auxiliary film layer 36 away from the second inorganic film layer 35 reflect the light emitted by the light emitting unit 20, and the light reflected by the surface of the third auxiliary film layer 36 away from the second inorganic film layer 35 will interfere with the light reflected by the contact interface between the second inorganic film layer 35 and the third auxiliary film layer 36, weakening the reflection effect of the contact interface between the second inorganic film layer 35 and the third auxiliary film layer 36. Therefore, the thickness of the second inorganic film layer 35 will not have a great influence on the viewing angle characteristics, the color shift of viewing angles or the uneven color rendering caused by the non-uniform thickness of the second inorganic film layer 35 is reduced or even eliminated, and the display effect of the display panel 100 is improved.

In some optional embodiments, the third auxiliary film layer 36 is an inorganic material layer. For example, the second inorganic film layer 35 is formed by chemical deposition and/or atomic layer deposition, and the third auxiliary film layer 36 is an inorganic material layer, so that the third auxiliary film layer 36 can be manufactured by a same manufacturing process with the second inorganic film layer 35, the manufacturing process of the display panel 100 is simplified.

Optionally, the third auxiliary film layer 36 and the second inorganic film layer 35 have a same composition. In these optional embodiments, the compositions of the third auxiliary film layer 36 and the second inorganic film layer 35 are the same, and in the manufacturing process of the display panel 100, after the second inorganic film layer 35 is formed, the third auxiliary film layer 36 can be subsequently formed by merely adjusting the parameters of chemical deposition and/or atomic layer deposition, the manufacturing process can be further simplified and the manufacturing efficiency of the display panel 100 is improved.

Optionally, the material of the third auxiliary film layer 36 includes one or more of silicon nitride and silicon oxynitride.

The third auxiliary film layer 36 may be a single-layer structure layer. Alternatively, in some other optional embodiments, the third auxiliary film layer 36 is a composite structure layer.

Figure 13:
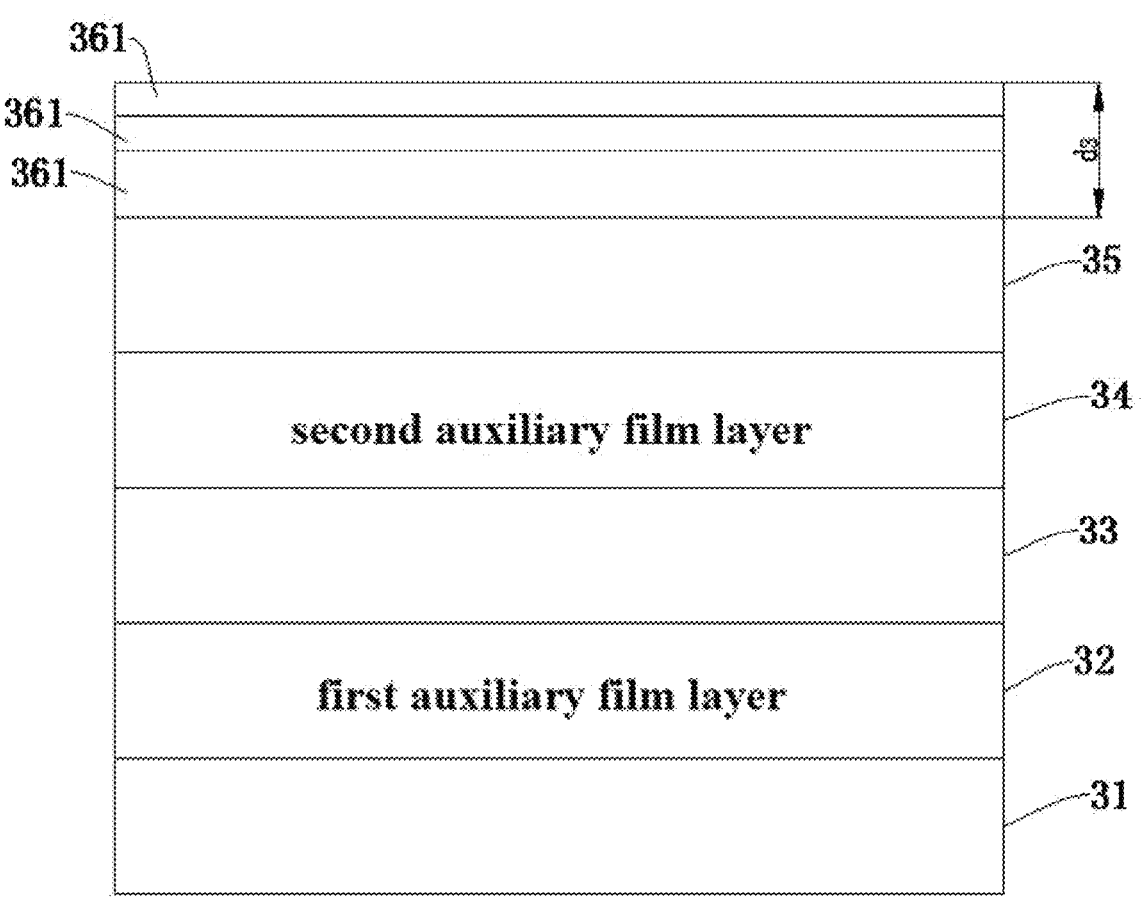
FIG. 13 shows a schematic structural diagram of an encapsulation layer in a display panel according to yet another embodiment in which the third auxiliary film layer 36 includes a plurality of third film layers 361.

As shown in FIG. 13, if the third auxiliary film layer 36 is a composite structure layer, the third auxiliary film layer 36 includes W third film layers 361 that are stacked, and in the direction from the organic film layer 33 to the second inorganic film layer 35, the refractive index of the p-th third film layer 361 is greater than the refractive index of the (p+1)-th third film layer 361, W is a positive integer greater than or equal to 2, and p=1, 2, 3, . . . , W−1

In these optional embodiments, the third auxiliary film layer 36 is configured as a composite structure layer, and with a plurality of the third film layers 361, the transmittance-increasing effect of the third auxiliary film layer 36 can be further improved, so that the reflection effect of the contact interface between the second inorganic film layer 35 and the third auxiliary film layer 36 is weakened, the color shift of viewing angles or the uneven color rendering caused by the non-uniform thickness of the second inorganic film layer 35 is reduced or even eliminated, and the display effect of the display panel 100 is further improved.

If the third auxiliary film layer 36 includes a plurality of the third film layers 361, the thicknesses of the plurality of the third film layers 361 may be the same or different.

The thickness of the third auxiliary film layer 36 may be set in a variety of manners. In some optional embodiments, the thickness $d_3$ of the third auxiliary film layer 36 satisfies:

$$d_3=(2k_3-1)\lambda/4n_3 \qquad (3)$$

in which $n_3$ is the refractive index of the third auxiliary film layer 36, $\lambda$ is the wavelength of visible light, and $k_3$ is a positive integer The influence of the third auxiliary film layer 36 on the display effect of the display panel 100 under a condition that the thickness $d_3$ of the third auxiliary film layer 36 satisfies the above equation (3) will be described below with reference to FIG. 14.

Figure 14:
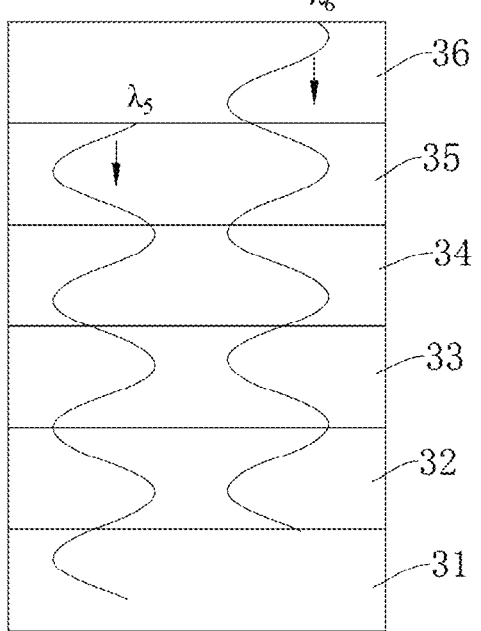
FIG. 14 shows a schematic waveform diagram of yet another light.

As shown in FIG. 14, assuming that the contact interface between the second inorganic film layer 35 and the third auxiliary film layer 36 reflects the light emitted by the light emitting unit 20 to form a fifth light ray having a fifth waveform $\lambda_5$, and the surface of the third auxiliary film layer 36 away from the second inorganic film layer 35 reflects the light emitted by the light emitting unit 20 to form a sixth light ray having a sixth waveform $\lambda_6$.

In these optional embodiments, if the thickness $d_3$ of the third auxiliary film layer 36 satisfies the above equation (3), the sixth waveform $\lambda_6$ and the fifth waveform $\lambda_5$ cancel each other out, and the peak of the sixth waveform 26 overlaps the trough of the fifth waveform $\lambda_5$, therefore the sixth light ray can eliminate the fifth light ray, so that the reflection effect of the contact interface between the second inorganic film layer 35 and the third auxiliary film layer 36 is weakened or even eliminated, the color shift of viewing angles or the uneven color rendering caused by the non-uniform thickness of the second inorganic film layer 35 is reduced or even eliminated, and the display effect of the display panel 100 is further improved.

In some optional embodiments, the value of $\lambda$ is 470 nm~780 nm, the light reflected by the contact interface between the first inorganic film layer 31 and the first auxiliary film layer 32 can be better eliminated, and the display effect is improved.

In some optional embodiments, $\lambda$ is the wavelength of green light; alternatively, $\lambda$ is the wavelength of red light; alternatively, $\lambda$ is the wavelength of blue light, the display effect of the display panel 100 can be further improved.

In some optional embodiments, the thickness $d_3$ of the third auxiliary film layer 36 is 60 nm~120 nm. If the value of the thickness of the third auxiliary film layer 36 is within the above range, the display panel 100 will not be too thick, and a good display effect can be guaranteed.

Figure 15:
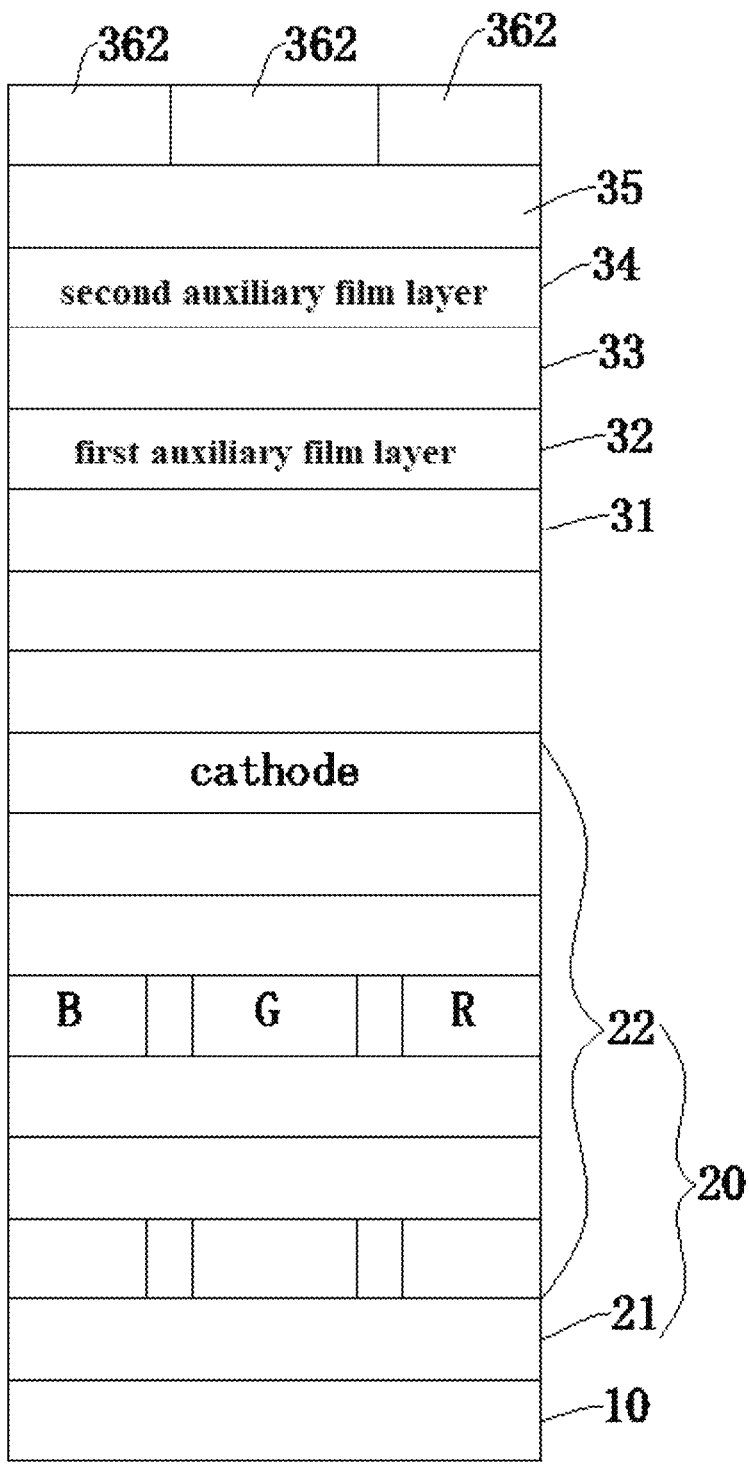
FIG. 15 shows a cross-sectional view taken along A-A in FIG. 3 according to yet another embodiment in which the third auxiliary film layer 36 includes a plurality of third auxiliary sub-layers 362 arranged in an array.

As shown in FIG. 15, in some other optional embodiments, the third auxiliary film layer 36 includes a plurality of third auxiliary sub-layers 362 arranged in an array, each of the third auxiliary sub-layers 362 corresponds to the sub-pixels 110 of the display panel 100, and the thicknesses of the third auxiliary sub-layers 362 corresponding to the sub-pixels 110 with a same color are the same.

For example, in some optional embodiments, the display panel 100 includes the red sub-pixels 111, the green sub-pixels 112 and the blue sub-pixels 113, the plurality of third auxiliary sub-layers 362 are arranged correspondingly to the red sub-pixels 111, the green sub-pixels 112 and the blue sub-pixels 113, respectively, and the thicknesses of the third auxiliary sub-layers 362 corresponding to the sub-pixels 110 with a same color are the same.

The light emitting units 20 corresponding to the red sub-pixels 111, the green sub-pixels 112 and the blue sub-pixels 113 emit red light, green light and blue light, respectively, and the wavelengths of red light, green light and blue light are different. The contact interface between the second inorganic film layer 35 and the third auxiliary film layer 36 reflects the light emitted by the light emitting unit 20 to form the fifth light ray, the waveforms of the fifth light rays formed correspondingly to the sub-pixels 110 with different colors are different, and the waveforms of the fifth light rays formed correspondingly to the sub-pixels 110 with a same color are the same.

In these optional embodiments, the thicknesses of the third auxiliary sub-layers 362 corresponding to the sub-pixels 110 with a same color are the same, so that for the sub-pixels 110 with the same color, the distances between adjacent two peaks in the waveforms of the sixth light ray and the fifth light ray are the same and the eliminating effect of the sixth light ray to the fifth light ray are the same, therefore the reflection effect of the contact interface between the second inorganic film layer 35 and the third auxiliary film layer 36 can be further eliminated, the color shift of viewing angles or the uneven color rendering caused by the non-uniform thickness of the second inorganic film layer 35 is eliminated, and the display effect of the display panel 100 is improved.

Optionally, if the third auxiliary film layer 36 is a composite structure layer and includes a plurality of the third film layers 361 that are stacked, the third auxiliary sub-layers 362 may be composite structure layers, and each of the third auxiliary sub-layers 362 includes a plurality of the third film layers 361 that are stacked.

In some optional embodiments, the thickness of the third auxiliary sub-layer 362 and the wavelength of the light emitted by its corresponding sub-pixel 110 are in a linear relationship.

In these optional embodiments, by appropriately setting the thickness of the third auxiliary sub-layer 362, for example, obtaining the thickness of each of the third auxiliary sub-layers 362 through the above equation (3), and selecting $\lambda$ as the wavelength of the light emitted by the sub-pixel 110 corresponding to the third auxiliary sub-layer 362, the sixth light ray and the fifth light ray can be canceled, so that the color shift of viewing angles or the uneven color rendering caused by the non-uniform thickness of the second inorganic film layer 35 is eliminated, and the display effect of the display panel 100 is improved.

Optionally, the display panel 100 may include only the first auxiliary film layer 32; alternatively, the display panel 100 may include the first auxiliary film layer 32 and the second auxiliary film layer 34; alternatively, the display panel 100 may include the first auxiliary film layer 32 and the third auxiliary film layer 36; alternatively, the display panel 100 may include the first auxiliary film layer 32, the second auxiliary film layer 34 and the third auxiliary film layer 36.

The first auxiliary film layer 32 is closest to the light emitting unit 20, and the display effect of the display panel 100 can be improved by arranging the first auxiliary film layer 32. Moreover, by additionally arranging the second auxiliary film layer 34 and/or the third auxiliary film layer 36, the display effect of the display panel 100 can be further improved.

Figure 16:
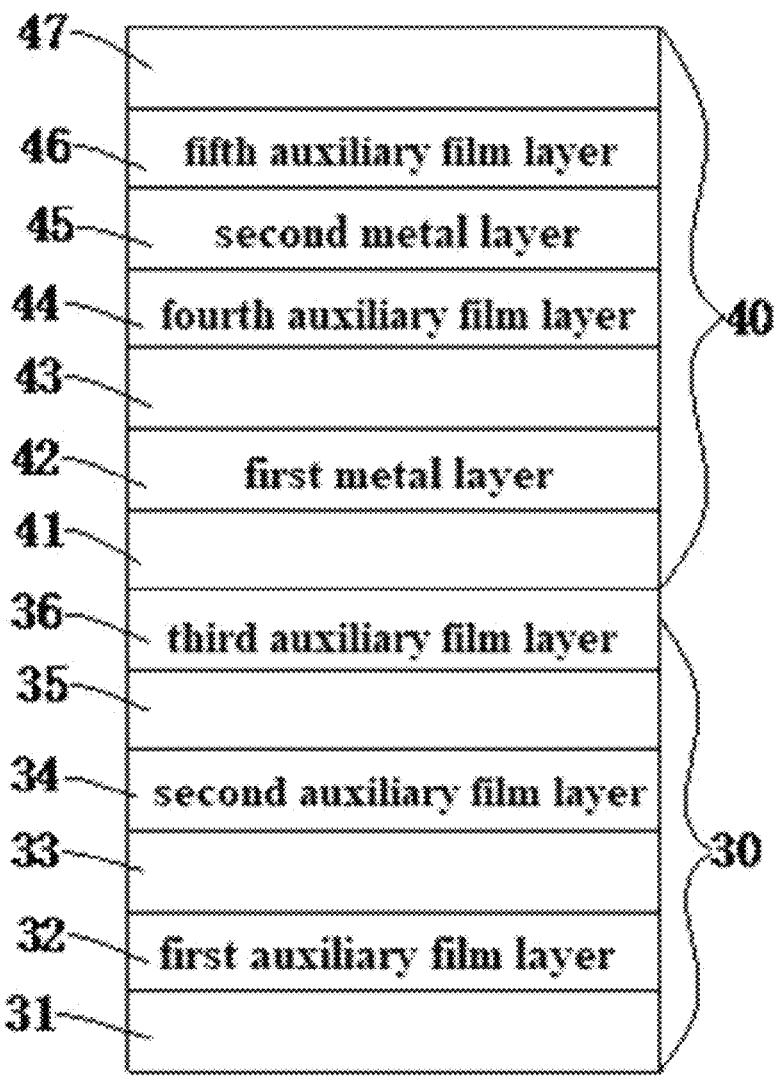
FIG. 16 shows a cross-sectional view taken along A-A in FIG. 3 according to yet another embodiment in which the display panel 100 further includes the touch layer 40 located on the encapsulation layer 30, the touch layer 40 includes the third inorganic film layer 41 disposed toward the encapsulation layer 30, and the third auxiliary film layer 36 is arranged between the second inorganic film layer 35 and the third inorganic film layer 41.

As shown in FIG. 16, in some optional embodiments, the display panel 100 further includes the touch layer 40 located on the encapsulation layer 30, at least a part of one of the combinational structure layers is arranged in the encapsulation layer 30, and another part of the one of the combinational structure layers is arranged in the touch layer 40. That is, the encapsulation layer 30 includes a part of the combinational structure layer and the touch layer 40 includes another part of the combinational structure layer, in other words, the encapsulation layer 30 and the touch layer 40 include different structure layers in the same combinational structure layer. The encapsulation layer 30 includes the second inorganic film layer 35 disposed toward the touch layer 40, the touch layer 40 includes the third inorganic film layer 41 disposed toward the encapsulation layer 30, and the third auxiliary film layer 36 is arranged between the second inorganic film layer 35 and the third inorganic film layer 41. In the combinational structure layer, the third structure layer is the third inorganic film layer 41, the second structure layer is the third auxiliary film layer 36, and the first structure layer is the second inorganic film layer 35. That is, the refractive index of the second inorganic film layer 35 is greater than the refractive index of the third auxiliary film layer 36, and the refractive index of the third auxiliary film layer 36 is greater than the refractive index of the third inorganic film layer 41.

In these optional embodiments, the third auxiliary film layer 36 is arranged between the second inorganic film layer 35 and the third inorganic film layer 41, and the refractive index of the third auxiliary film layer 36 is between the refractive index of the second inorganic film layer 35 and the refractive index of the third inorganic film layer 41. The refractive index of the third auxiliary film layer 36 is closer to the refractive index of the second inorganic film layer 35 rather than the refractive index of the third inorganic film layer 41, the light transmittance of the display panel 100 can be increased and the power consumption of the display panel 100 is reduced.

Optionally, the refractive indices of the second inorganic film layer 35, the third auxiliary film layer 36 and the third inorganic film layer 41 satisfy:

$$n_{\beta} = \sqrt{n_2 \times n_3}$$

in which $n_{\beta}$ is the refractive index of the third auxiliary film layer 36, $n_2$ is the refractive index of the second inorganic film layer 35, and $n_3$ is the refractive index of the third inorganic film layer 41.

If the refractive indices of the second inorganic film layer 35, the third auxiliary film layer 36 and the third inorganic film layer 41 satisfy the above equation, the transmittances of the second inorganic film layer 35, the third auxiliary film layer 36 and the third inorganic film layer 41 can be effectively increased, the light transmittance of the display panel 100 is further increased, and the power consumption of the display panel 100 is reduced.

In some optional embodiments, the refractive index of the third auxiliary film layer 36 is 1.80~1.90. Alternatively, the refractive index of the third auxiliary film layer 36 is 1.84. For example, the refractive index of the second inorganic film layer 35 is 1.78, the refractive index of the third inorganic film layer 41 is 1.9, and then the refractive index of the third auxiliary film layer 36 may be 1.84.

In some optional embodiments, the thickness of the third auxiliary film layer 36 is 80 nm~100 nm. Alternatively, the thickness of the third auxiliary film layer 36 is 90 nm.

In some optional embodiments, the touch layer 40 includes a metal layer and an optical adhesive layer 47, and the metal layer includes a first metal layer 42 and a second metal layer 45. A fourth inorganic film layer 43 is arranged between the first metal layer 42 and the second metal layer 45, an optimization layer is arranged between the fourth inorganic film layer 43 and the optical adhesive layer 47, and the refractive index of the optimization layer is less than the refractive index of the fourth inorganic film layer 43 and greater than the refractive index of the optical adhesive layer 47.

In these optional embodiments, the optimization layer is arranged between the fourth inorganic film layer 43 and the optical adhesive layer 47, and the refractive index of the optimization layer is less than the refractive index of the fourth inorganic film layer 43 and greater than the refractive index of the optical adhesive layer 47, and in such a case, the touch layer 40 includes a combinational structure layer. By arranging the optimization layer, the total reflection angle of the touch layer 40 can be increased and the amount of light that is totally reflected can be reduced, so that the light transmittance is increased and the power consumption of the display panel 100 is reduced.

The number of the optimization layer may be one, and the one optimization layer is arranged between the fourth inorganic film layer 43 and the second metal layer 45; alternatively, the one optimization layer is arranged between the second metal layer 45 and the optical adhesive layer 47.

In some embodiments, the optimization layer includes a fifth auxiliary film layer 46 arranged between the second metal layer 45 and the optical adhesive layer 47, and in a same combinational structure layer, the first structure layer is the fourth inorganic film layer 43, the second structure layer is the fifth auxiliary film layer 46, and the third structure layer is the optical adhesive layer 47. That is, the refractive indices of the fourth inorganic film layer 43, the fifth auxiliary film layer 46 and the optical adhesive layer 47 decrease subsequently. The total reflection angle can be increased and the amount of light that is totally reflected can be reduced, so that the light transmittance of the display panel 100 is increased and the power consumption of the display panel 100 is reduced.

Optionally, the optimization layer further includes a fourth auxiliary film layer 44 located between the fourth inorganic film layer 43 and the second metal layer 45, and in a same combinational structure layer, the first structure layer is the fourth inorganic film layer 43, the second structure layer is the fourth auxiliary film layer 44, and the third structure layer is the fifth auxiliary film layer 46. That is, the refractive index of the fourth inorganic film layer 43 is greater than the refractive index of the fourth auxiliary film layer 44, and the refractive index of the fourth auxiliary film layer 44 is greater than the refractive index of the fifth auxiliary film layer 46.

In these optional embodiments, the optimization layer includes the fourth auxiliary film layer 44 and the fifth auxiliary film layer 46, and in the direction from the fourth inorganic film layer 43 to the optical adhesive layer 47, the refractive indices of the fourth inorganic film layer 43, the fourth auxiliary film layer 44, the fifth auxiliary film layer 46 and the optical adhesive layer 47 decrease subsequently, the total reflection angle can be further increased and the amount of light that is totally reflected can be reduced, so that the light transmittance of the display panel 100 is increased and the power consumption of the display panel 100 is reduced.

Optionally, the refractive indices of the fourth inorganic film layer 43, the fifth auxiliary film layer 46 and the optical adhesive layer 47 satisfy:

$$n_{y2} = \sqrt{n_4 \times n_0}$$

in which $n_{y2}$ is the refractive index of the fifth auxiliary film layer 46, $n_4$ is the refractive index of the fourth inorganic film layer 43, and $n_0$ is the refractive index of the optical adhesive layer 47.

If the refractive indices of the fourth inorganic film layer 43, the fifth auxiliary film layer 46 and the optical adhesive layer 47 satisfy the above equation, the transmittances of the fourth inorganic film layer 43, the fifth auxiliary film layer 46 and the optical adhesive layer 47 can be effectively increased, the light transmittance of the display panel 100 is further increased, and the power consumption of the display panel 100 is reduced.

Optionally, the refractive indices of the fourth inorganic film layer 43, the fourth auxiliary film layer 44 and the fifth auxiliary film layer 46 satisfy:

$$n_{y1} = \sqrt{n_4 \times n_{y2}}$$

in which $n_{y1}$ is the refractive index of the fourth auxiliary film layer 44, $n_{y2}$ is the refractive index of the fifth auxiliary film layer 46, and $n_4$ is the refractive index of the fourth inorganic film layer 43.

If the refractive indices of the fourth inorganic film layer 43, the fourth auxiliary film layer 44 and the fifth auxiliary film layer 46 satisfy the above equation, the transmittances of the fourth inorganic film layer 43, the fourth auxiliary film layer 44 and the fifth auxiliary film layer 46 can be effectively increased, the light transmittance of the display panel 100 is further increased, and the power consumption of the display panel 100 is reduced.

In some optional embodiments, the refractive index of the fifth auxiliary film layer 46 is 1.65~1.75. Alternatively, the refractive index of the fifth auxiliary film layer 46 is 1.69. Optionally, the refractive index of the fourth auxiliary film layer 44 is 1.75~1.85. Alternatively, the refractive index of the fourth auxiliary film layer 44 is 1.79. For example, the refractive index of the fourth inorganic film layer 43 is 1.9 and the refractive index of the optical adhesive layer 47 is 1.5, then the refractive index of the fifth auxiliary film layer 46 may be 1.69 and the refractive index of the fourth auxiliary film layer 44 may be 1.79.

For example, the third inorganic film layer 41 and the fourth inorganic film layer 43 are silicon nitride layers. The fourth auxiliary film layer 44 and the fifth auxiliary film layer 46 are, for example, inorganic material layers, so that the fourth auxiliary film layer 44 and the fifth auxiliary film layer 46 can be manufactured by a same process with the fourth inorganic film layer 43. For example, the fourth inorganic film layer 43 is manufactured by chemical deposition and the fourth auxiliary film layer 44 is an inorganic material layer, the fourth auxiliary film layer 44 can also be manufactured by chemical deposition. In the manufacturing process of the display panel 100, after the fourth inorganic film layer 43 is formed, the fourth auxiliary film layer 44 can be formed by merely changing the parameters of chemical deposition without moving the equipment for chemical deposition. Therefore, the manufacturing process of the display panel 100 can be simplified, and the manufacturing efficiency of the display panel 100 is improved.

In some optional embodiments, if the refractive indices of the third inorganic film layer 41 and the fourth inorganic film layer 43 are different, a third optimization layer may be further arranged between the third inorganic film layer 41 and the fourth inorganic film layer 43, and the refractive index of the third optimization layer is between the refractive index of the third inorganic film layer 41 and the refractive index of the fourth inorganic film layer 43, so that the power consumption of the display panel 100 can be further reduced and the display effect of the display panel 100 is improved.

In some optional embodiments, for example, a cover plate is further arranged on the optical adhesive layer 47.

In some optional embodiments, the thickness of the fourth auxiliary film layer 44 is 80 nm~100 nm, for example, 90 nm.

In some optional embodiments, the thickness of the fifth auxiliary film layer 46 is 80 nm~100 nm, for example, 90 nm.

The embodiments of the present application further provide a display apparatus including the display panel 100 of any one of the above embodiments. Since the display apparatus according to the embodiments of the present application includes the above display panel 100, the display apparatus has the beneficial effects of the above display panel 100, which will not be repeated herein.

EXAMPLES

The following examples more specifically describe the disclosure of the present application, which are intended to be illustrative only, as various modifications and changes within the scope of the disclosure of the present application are apparent to those skilled in the art.

Example 1

Taking the embodiment shown in FIG. 4 as an example, the display panel 100 includes the substrate 10, the light emitting unit 20 located on the substrate 10, and the encapsulation layer 30 located on the light emitting unit 20. The encapsulation layer 30 includes the first inorganic film layer 31, the first auxiliary film layer 32, the organic film layer 33 and the second inorganic film layer 35. The refractive index of the first inorganic film layer 31 is 1.75. The first auxiliary film layer 32 is an inorganic material layer and has the same composition as the first inorganic film layer 31, but the thickness of the first auxiliary film layer 32 is 90 nm and the refractive index of the first auxiliary film layer 32 is 1.65. Further, the thickness of the organic film layer 33 is 10 μm and the refractive index of the organic film layer 33 is 1.5. The thickness of the second inorganic film layer 35 is 1000 nm and the refractive index of the second inorganic film layer 35 is 1.8.

Comparative Example 1

Taking the typical OLED display panel shown in FIG. 1 as an example, the display panel in Comparative Example 1 has the same substrate 10 and light emitting unit 20 as the display panel 100 in Example 1, but the encapsulation layer 30 in Comparative Example 1 includes the first inorganic film layer 31, the organic film layer 33 and the second inorganic film layer 35, without the first auxiliary film layer 32. Moreover, the parameters (thickness and refractive index) of the organic film layer 33 and the second inorganic film layer 35 and the refractive index of the first inorganic film layer 31 are the same in Comparative Example 1 and Example 1.

Testing Portions in Example 1 and Comparative Example 1

In Example 1 and Comparative Example 1, the trajectory of white light on the display panel is respectively obtained under a condition that the thickness of the first inorganic film layer 31 is 950 nm, 960 nm, 970 nm, 980 nm, 990 nm, 1000 nm, 1010 nm, 1020 nm, 1030 nm, 1040 nm and 1050 nm.

FIG. 17 shows the trajectory diagram of white light under different thicknesses of the first inorganic film layer 31 in Example 1. FIG. 18 shows the trajectory diagram of white light under different thicknesses of the first inorganic film layer 31 in Comparative Example 1. It can be seen from a comparison between FIG. 17 and FIG. 18 that in Example 1, the change of thickness of the first inorganic film layer 31 has less influence on the trajectory of white light. Therefore, if the first auxiliary film layer 32 is arranged, the color shift of viewing angles or the uneven color rendering caused by the non-uniform thickness of the first inorganic film layer 31 can be reduced or even eliminated, and the display effect of the display panel is improved.

The above embodiments of the present application do not exhaustively describe all the details, nor do they limit the present application to merely the described specific embodiments. Obviously, according to the above description, many modifications and changes can be made. These embodiments are specifically described in the specification to better explain the principles and practical applications of the present application, so that those skilled in the art can make good use of the present application and make modifications based on the present application. The scope of the present application is only defined by the appended claims, along with their full scope and equivalents.

What is claimed is:

1. A display panel, comprising:

a substrate;

a light emitting unit located on the substrate;

one or more combinational structure layers located on a side of the light emitting unit away from the substrate, each of the combinational structure layers comprising a first structure layer, a second structure layer and a third structure layer, a refractive index of the first structure layer being greater than a refractive index of the second structure layer, and the refractive index of the second structure layer being greater than a refractive index of the third structure layer;

an encapsulation layer stacked on the side of the light emitting unit away from the substrate; and a touch layer stacked on a side of the encapsulation layer away from the substrate, wherein the encapsulation layer comprises a part of one of the combinational structure layers, and the touch layer comprises another part of the one of the combinational structure layers;

the encapsulation layer comprises a second inorganic film layer disposed toward the touch layer, the touch layer comprises a third inorganic film layer disposed toward the encapsulation layer, and a third auxiliary film layer being arranged between the third inorganic film layer and the second inorganic film layer; and in the one of the combinational structure layers, the first structure layer is the second inorganic film layer, the second structure layer is the third auxiliary film layer, and the third structure layer is the third inorganic film layer.

2. The display panel of claim 1, wherein the refractive index of the first structure layer is N1, the refractive index of the second structure layer is N2, the refractive index of the third structure layer is N3, and N1, N2 and N3 satisfy: N2= $\sqrt{N1 \times N3}$.

3. The display panel of claim 1, wherein the encapsulation layer comprises at least a first inorganic film layer, and an organic film layer;

the encapsulation layer further comprises a first auxiliary film layer located between the first inorganic film layer and the organic film layer, and in a same combinational structure layer, the first structure layer is the first inorganic film layer; and/or the encapsulation layer further comprises a second auxiliary film layer located between the organic film layer and the second inorganic film layer.

4. The display panel of claim 3, wherein the first auxiliary film layer is a single-layer structure layer; or the first auxiliary film layer is a composite structure layer comprising N stacked first film layers, and in a direction from the first inorganic film layer to the organic film layer, a refractive index of an i-th first film layer is greater than a refractive index of a (i+1)-th first film layer, N is a positive integer greater than or equal to 2, and i=1, 2, 3, . . . , N−1.

5. The display panel of claim 3, wherein a thickness $d_1$ of the first auxiliary film layer satisfies:

$$d_1 = (2k_1 - 1)\lambda/4n_1$$

wherein $n_1$ is a refractive index of the first auxiliary film layer, $\lambda$ is a wavelength of visible light, and $k_1$ is a positive integer.

6. The display panel of claim 5, wherein the thickness $d_1$ of the first auxiliary film layer is 60 nm- 120 nm.

7. The display panel of claim 3, wherein the first auxiliary film layer comprises a plurality of first auxiliary sub-layers arranged in an array, each of the first auxiliary sub-layers corresponds to sub-pixels of the display panel, and thicknesses of the first auxiliary sub-layers corresponding to sub-pixels emitting a same color are the same.

8. The display panel of claim 3, wherein a refractive index of the first inorganic film layer is 1.7-4.8, a refractive index of the first auxiliary film layer is 1.6-4.7, and a refractive index of the organic film layer is 1.4-1.6.

9. The display panel of claim 3, wherein the first auxiliary film layer and the first inorganic film layer have a same composition.

10. The display panel of claim 3, wherein the encapsulation layer further comprises the second auxiliary film layer located between the organic film layer and the second inorganic film layer;

the second auxiliary film layer is a single-layer structure layer; or the second auxiliary film layer is a composite structure layer comprising M stacked second film layers, and in a direction from the organic film layer to the second inorganic film layer, a refractive index of a j-th second film layer is less than a refractive index of a (j+1)-th second film layer, M is a positive integer greater than or equal to 2, and j=1, 2, 3, . . . , M−1; the second auxiliary film layer is an inorganic material layer.

11. The display panel of claim 10, wherein a thickness $d_2$ of the second auxiliary film layer satisfies:

$$d_2 = (2k_2 - 1)\lambda/4n_2$$

wherein $n_2$ is a refractive index of the second auxiliary film layer, $\lambda$ is a wavelength of visible light, and $k_2$ is a positive integer.

12. The display panel of claim 11, wherein the thickness $d_2$ of the second auxiliary film layer is 60 nm- 120 nm.

13. The display panel of claim 1, wherein the third auxiliary film layer is a single-layer structure layer, or the third auxiliary film layer is a composite structure layer comprising W third film layers that are stacked, and in a direction from the second inorganic film layer to the third inorganic film layer, a refractive index of a p-th third film layer is greater than a refractive index of a (p+1)-th third film layer, W is a positive integer greater than or equal to 2, and p=1, 2, 3, . . . , W−1;

a thickness $d_3$ of the third auxiliary film layer satisfies:

$$d_3 = (2k_3-1)\lambda/4n_3$$

wherein $n_3$ is a refractive index of the third auxiliary film layer, $\lambda$ is a wavelength of visible light, and $k_3$ is a positive integer.

14. The display panel of claim 13, wherein the thickness $d_3$ of the third auxiliary film layer is 60 nm- 120 nm.

15. A display apparatus comprising the display panel of claim 1.

16. A display panel, comprising:

a substrate;

a light emitting unit located on the substrate;

one or more combinational structure layers located on a side of the light emitting unit away from the substrate, each of the combinational structure layers comprising a first structure layer, a second structure layer and a third structure layer, a refractive index of the first structure layer being greater than a refractive index of the second structure layer, and the refractive index of the second structure layer being greater than a refractive index of the third structure layer;

an encapsulation layer stacked on the side of the light emitting unit away from the substrate; and a touch layer stacked on a side of the encapsulation layer away from the substrate, wherein the touch layer comprising at least one of the combinational structure layers, or each of the encapsulation layer and the touch layer comprising at least one of the combinational structure layers, the touch layer comprises a fourth inorganic film layer, a second metal layer, and an optical adhesive layer that are stacked on the encapsulation layer, a fourth auxiliary film layer located between the fourth inorganic film layer and the second metal layer, and a fifth auxiliary film layer located between the second metal layer and the optical adhesive layer; and in a same combinational structure layer, the first structure layer is the fourth inorganic film layer, the second structure layer is the fourth auxiliary film layer, and the third structure layer is the fifth auxiliary film layer.

17. The display panel of claim 16, wherein the touch layer further comprises a third inorganic film layer and a first metal layer that are stacked on the encapsulation layer.

*  *  *  *  *